(12) United States Patent
Nakano et al.

(10) Patent No.: US 11,912,412 B2
(45) Date of Patent: Feb. 27, 2024

(54) SUBSTRATE WORKING SYSTEM AND METHOD FOR CONVEYING COMPONENT IN SUBSTRATE WORKING SYSTEM

(71) Applicant: YAMAHA HATSUDOKI KABUSHIKI KAISHA, Iwata (JP)

(72) Inventors: Masayuki Nakano, Iwata (JP); Tomoyoshi Utsumi, Iwata (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 640 days.

(21) Appl. No.: 16/332,772

(22) PCT Filed: Sep. 16, 2016

(86) PCT No.: PCT/JP2016/077511
§ 371 (c)(1),
(2) Date: Mar. 12, 2019

(87) PCT Pub. No.: WO2018/051498
PCT Pub. Date: Mar. 22, 2018

(65) Prior Publication Data
US 2019/0359331 A1    Nov. 28, 2019

(51) Int. Cl.
*B64D 1/12* (2006.01)
*B64C 39/02* (2023.01)
(Continued)

(52) U.S. Cl.
CPC .............. *B64D 1/12* (2013.01); *B64C 39/024* (2013.01); *G08G 5/0069* (2013.01); *B64U 2101/60* (2023.01)

(58) Field of Classification Search
CPC ... B64D 1/12; B64C 39/024; B64C 2201/128; G08G 5/0069
(Continued)

(56) References Cited

U.S. PATENT DOCUMENTS

2015/0120094 A1* 4/2015 Kimchi ............... G05D 1/00
                                                              701/3
2015/0158587 A1   6/2015 Patrick et al.
2016/0340006 A1* 11/2016 Tang ................... B64C 39/024

FOREIGN PATENT DOCUMENTS

JP    2008-207705 A    9/2008
JP    2009-008655 A    1/2009
(Continued)

OTHER PUBLICATIONS

International Search Report issued in PCT/JP2016/077511; dated Dec. 13, 2016.
(Continued)

*Primary Examiner* — Maceeh Anwari
(74) *Attorney, Agent, or Firm* — Studebaker & Brackett PC (57) ABSTRACT

A substrate working system includes a plurality of substrate working apparatuses, a component storage that stores a device and a component to be used by the substrate working apparatuses, and a component conveyance flight vehicle. The component conveyance flight vehicle conveys a conveyance article by flying from the component storage to a predetermined position corresponding to a predetermined substrate working apparatus while holding the conveyance article based on necessary article information of the substrate working apparatuses.

20 Claims, 6 Drawing Sheets

(51) Int. Cl.
*G08G 5/00* (2006.01)
*B64U 101/60* (2023.01)

(58) Field of Classification Search
USPC .............................................................. 701/3
See application file for complete search history.

(56) References Cited

FOREIGN PATENT DOCUMENTS

| JP | 2014-162316 | A | | 9/2014 |
|---|---|---|---|---|
| JP | 2015-001450 | A | | 1/2015 |
| JP | 2015-195030 | A | | 11/2015 |
| JP | 2015195030 | | * | 11/2015 |
| JP | 2016-018968 | A | | 2/2016 |
| JP | 5887641 | B1 | | 3/2016 |
| WO | 2014/010084 | A1 | | 1/2014 |
| WO | WO-2014010084 | A1 | * | 1/2014 ........... H05K 13/086 |
| WO | 2015/177760 | A2 | | 11/2015 |
| WO | 2016/121076 | A1 | | 8/2016 |

OTHER PUBLICATIONS

Written Opinion issued in PCT/JP2016/077511; dated Jan. 13, 2016.
An Office Action; "Notification of Reasons for Refusal," Mailed by the Japanese Patent Office dated Mar. 3, 2020, which corresponds to Japanese Patent Application No. 2018-539476 and is related to U.S. Appl. No. 16/332,772 with English language translation.
An Office Action; "Notice of Reasons for Refusal," mailed by the Japanese Patent Office dated Sep. 8, 2020, which corresponds to Japanese Patent Application No. 2018-539476 and is related to U.S. Appl. No. 16/332,772 with English language translation.

* cited by examiner

SUBSTRATE WORKING SYSTEM AND METHOD FOR CONVEYING COMPONENT IN SUBSTRATE WORKING SYSTEM

CROSS-REFERENCE TO RELATED APPLICATION

This application is a National Stage of International Patent Application No. PCT/JP2016/077511, filed Sep. 16, 2016, the entire content of which is incorporated herein by reference.

BACKGROUND

Technical Field

The present disclosure relates to a substrate working system and a method for conveying a component in a substrate working system, and more particularly, to a substrate working system including a substrate working device and a method for conveying a component in a substrate working system.

Background Art

Conventionally, a substrate working system including a substrate working device is disposed in Japanese Patent Laid-Open No. 2016-18968, for example.

Japanese Patent Laid-Open No. 2016-18968 discloses a feeder replacement support system (substrate working system) including a mounting line in which a plurality of mounter modules are disposed adjacent to each other in the conveyance direction of a circuit board. In this feeder replacement support system, the mounter modules include feeder set bases on which a plurality of feeders are disposed, feeder replacement position indicators, a controller, and a feeder preparation carriage. The controller performs control of turning on the feeder replacement position indicator when any of the plurality of feeders runs short of components. In addition, a replacement feeder with which the feeder that runs short of components is replaced is disposed on the feeder preparation carriage or a feeder placement shelf. Furthermore, indicators are provided on the feeder preparation carriage or the feeder placement shelf. The controller performs control of turning on the indicators on the feeder preparation carriage or the feeder placement shelf. After visually recognizing the lighting of the feeder replacement position indicators on the mounting line, an operator moves from the mounting line to the feeder preparation carriage. Then, the operator conveys the replacement feeder based on the lighting of the indicator to the mounter module including the feeder that runs short of components, and replaces the feeder that runs short of components with the replacement feeder.

SUMMARY

In the feeder replacement support system disclosed in Japanese Patent Laid-Open No. 2016-18968, the operator moves between the mounter module and the feeder preparation carriage (feeder placement shelf), and conveys the replacement feeder. Therefore, the operator needs to move, and thus there is a disadvantage that the work burden on the operator increases. The plurality of mounter modules are disposed adjacent to each other, and thus when conveying the replacement feeder, the operator needs to move while bypassing mounter modules (several tens of mounter modules, for example) other than the mounter module to be replaced. Thus, the conveyance time required to convey the replacement feeder (devices and components to be used by the substrate working device) increases. Consequently, there is a problem that the work burden on the operator increases, and the conveyance time required to convey the components increases.

The present disclosure provides a substrate conveyance system and a method for conveying a component capable of reducing the work burden on an operator and reducing the conveyance time required to convey a component.

A substrate working system according to a first aspect of the present disclosure includes a plurality of substrate working apparatuses that perform work on a substrate on which a component is mounted, a component storage spaced apart from the plurality of substrate working apparatuses and that stores at least one of a device and the component to be used by the substrate working apparatuses, and a component conveyance flight vehicle that conveys a conveyance article by flying from the component storage to a predetermined position corresponding to a predetermined substrate working apparatus while holding the conveyance article including at least one of the device and the component based on necessary article information of the substrate working apparatuses.

As described above, the substrate working system according to the first aspect of the present disclosure includes the component conveyance flight vehicle that conveys the conveyance article by flying from the component storage to the predetermined position corresponding to the predetermined substrate working apparatus while holding the conveyance article including at least one of the device and the component based on the necessary article information of the substrate working apparatuses. Accordingly, an operator does not need to move and convey the device and the component from the component storage to the predetermined substrate working apparatus, and thus the work burden on the operator can be reduced. Furthermore, the component conveyance flight vehicle can fly so as to move over the substrate working apparatuses. Consequently, the component conveyance flight vehicle can convey the conveyance article at the shortest distance from the component storage to the predetermined substrate working apparatus by flying over the plurality of substrate working apparatuses without bypassing the plurality of substrate working apparatuses on the ground, and thus the time required to convey the conveyance article can be reduced. Accordingly, the time during which the substrate working apparatus is stopped due to the shortage of the component, for example, can be significantly reduced or prevented, and thus the substrate working system can efficiently perform the work on the substrate.

The aforementioned substrate working system according to the first aspect preferably further includes a controller that acquires the necessary article information from the plurality of substrate working apparatuses, and the component conveyance flight vehicle preferably conveys the conveyance article based on the necessary article information acquired by the controller. According to this structure, the conveyance article based on the necessary article information can be conveyed by the component conveyance flight vehicle, and thus appropriate conveyance articles can be easily conveyed to the substrate working apparatuses.

In this case, the component conveyance flight vehicle preferably performs autonomous flight to fly while being automatically operated, and the controller preferably controls the component conveyance flight vehicle in a state of holding the conveyance article to autonomously fly from the component storage to the predetermined position based on the necessary article information. According to this structure, the operator does not need to operate the component conveyance flight vehicle with a remote controller or the like, and thus the work burden on the operator can be effectively reduced.

In the aforementioned substrate working system in which the component conveyance flight vehicle autonomously flies, the controller preferably acquires degrees of request in which the plurality of substrate working apparatuses request the conveyance article based on the necessary article information of the plurality of substrate working apparatuses, and controls the component conveyance flight vehicle to preferentially convey the conveyance article with a higher degree of request. According to this structure, the conveyance article with a higher degree of request can be quickly conveyed. For example, the degree of request of the conveyance article to be conveyed to the substrate working apparatus that runs short of the component is increased such that the conveyance article can be quickly conveyed to the substrate working apparatus that runs short of the component, and thus stopping of the work due to the component shortage of the substrate working apparatus can be effectively significantly reduced or prevented. Furthermore, even when the work stops, an increase in downtime can be minimized.

In the aforementioned substrate working system including the controller, the component conveyance flight vehicle preferably holds a plurality of conveyance articles, and the controller preferably controls the component conveyance flight vehicle to hold the plurality of conveyance articles in a reverse order of an order in which the component conveyance flight vehicle conveys the plurality of conveyance articles. Here, when the shaft member is provided in the component conveyance flight vehicle and the shaft member passes through and holds the conveyance article, it is necessary to release the holding in the order reverse to the holding order. In consideration of this point, according to the present disclosure, the controller controls the component conveyance flight vehicle to hold the plurality of conveyance articles in the reverse order of the order in which the component conveyance flight vehicle conveys the plurality of conveyance articles. Thus, holding of the conveyance article can be released in the order of conveyance by the component conveyance flight vehicle, and thus when the conveyance articles are sequentially conveyed to a plurality of locations and the release operation is performed, the operation of releasing the conveyance article can be smoothly and efficiently performed.

In the aforementioned substrate working system including the controller, the controller preferably performs control of any of determining a flight path along which the component conveyance flight vehicle conveys the conveyance article in a flight area set in advance based on arrangement positions of the substrate working apparatuses, and determining the flight path in an area other than a flight prohibited area set in advance. According to this structure, the flight area or the flight prohibited area (the position of an obstacle, for example) is set in advance, and thus it is easy to determine the flight path along which the obstacle can be avoided when determining the flight path.

In the aforementioned substrate working system according to the first aspect, the component conveyance flight vehicle preferably extends in a vertical direction from a vicinity of a position of a center of gravity of the component conveyance flight vehicle in a plan view, and includes a shaft member that holds the conveyance article. According to this structure, unlike the case in which the conveyance article is held at a position away from the position of the center of gravity of the component conveyance flight vehicle, deviation of the position of the center of gravity of the component conveyance flight vehicle due to holding of the conveyance article can be significantly reduced or prevented. Consequently, deviation of the position of the center of gravity of the component conveyance flight vehicle is significantly reduced or prevented, and thus the component conveyance flight vehicle can stably fly.

In this case, the conveyance article preferably includes a reel including a through-hole provided in the vicinity of the position of the center of gravity in the plan view and through which the shaft member passes, and that stores the component to be mounted on the substrate. According to this structure, the shaft member passes through the reel such that the reel can be easily held by the shaft member of the component conveyance flight vehicle. Furthermore, when the substrate working apparatuses are constructed as component mounting apparatuses, components can be easily replenished in the component mounting apparatuses by conveying reels that store the components from the component storage to the component mounting apparatuses.

In the aforementioned substrate working system according to the first aspect, the predetermined position preferably includes at least one of a position in a vicinity of the predetermined substrate working apparatus and a position in a vicinity of an operator who performs the work on the predetermined substrate working apparatus. According to this structure, the conveyance article (the device and the component) can be conveyed to a position in the vicinity of the predetermined substrate working apparatus on which the operator performs the work or a position in the vicinity of the operator, and thus the operator can quickly replace the device or the component in the substrate working apparatus after acquiring the conveyance article.

A method for conveying a component according to a second aspect of the present disclosure is a method for conveying a component in a substrate working system including a plurality of substrate working apparatuses that perform work on a substrate on which the component is mounted, necessary article information is acquired from the plurality of substrate working apparatuses, and a component conveyance flight vehicle conveys a conveyance article by flying from a component storage spaced apart from the plurality of substrate working apparatuses and that stores at least one of a device and the component to be used by the substrate working apparatuses to a predetermined position corresponding to a predetermined substrate working apparatus while holding the conveyance article including at least one of the device and the component based on the necessary article information.

The method for conveying a component according to the second aspect of the present disclosure is configured as described above such that the method for conveying a component capable of reducing the work burden on an operator and reducing the conveyance time required to convey the component can be provided.

According to the present disclosure, as described above, it is possible to reduce the work burden on the operator and to reduce the conveyance time required to convey the component.

DETAILED DESCRIPTION

An embodiment embodying the present disclosure is hereinafter described on the basis of the drawings.

[Structure of Substrate Working System]

The structure of a substrate working system 100 according to an embodiment of the present disclosure is now described with reference to FIGS. 1 to 14.

Figure 1:
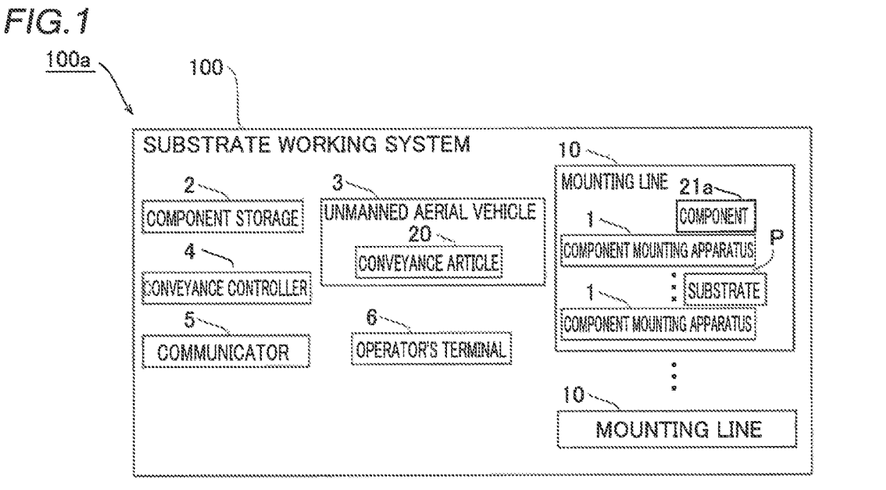
FIG. 1 is a block diagram showing the overall structure of a substrate working system according to an embodiment of the present disclosure.

As shown in FIG. 1, the substrate working system 100 is provided in a factory 100a that manufactures a substrate P by mounting components 21a on the substrate P, for example. Furthermore, the substrate working system 100 includes a plurality of component mounting apparatuses 1, a component storage 2, and an unmanned aerial vehicle (UAV) 3. The substrate working system 100 is an article conveyance system that conveys a conveyance article 20 to a conveyance article placement portion 11 (hereinafter referred to as the "placement portion 11") of each of the component mounting apparatuses 1 by flying the unmanned aerial vehicle 3. The component mounting apparatuses 1 are examples of a "component working apparatus" in the claims. The unmanned aerial vehicle 3 is an example of a "component conveyance flight vehicle" in the claims. The placement portion 11 is an example of a "predetermined position" in the claims.

Figure 2:
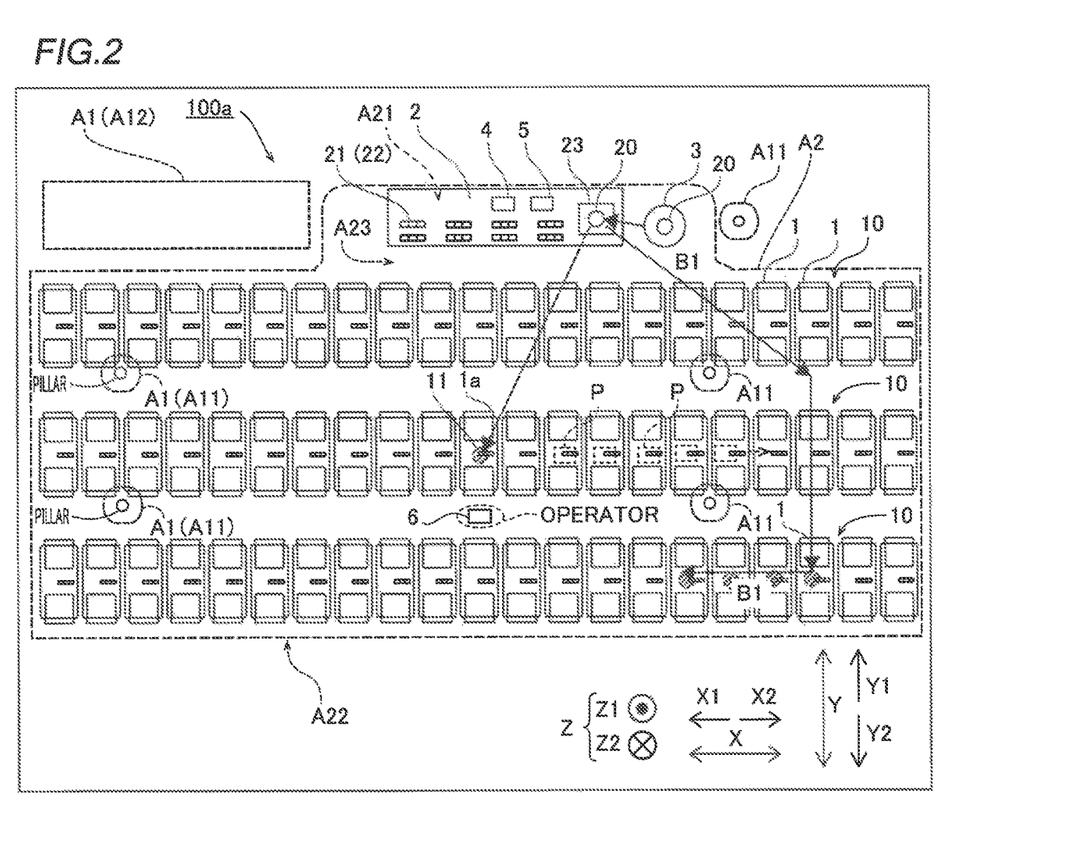
FIG. 2 is a diagram illustrating a flight path of an unmanned aerial vehicle in the substrate working system according to the embodiment of the present disclosure.

As shown in FIG. 2, the plurality of component mounting apparatuses 1 constitute mounting lines 10 for mounting the components 21a on the substrate P. Specifically, the plurality of component mounting apparatuses 1 are disposed along the conveyance direction (a direction parallel to an X-axis) of the substrate P on which the components 21a are mounted. In addition, the mounting lines 10 are provided in a plurality of rows (three rows in an example of FIG. 2) in parallel in a direction (vertical direction: direction parallel to a Y-axis, for example) that intersects with the conveyance direction of the substrate P. Although not shown, a printer that prints solder or the like on the substrate P on which the components 21a are mounted is provided on the upstream side (arrow X1 direction side) of the component mounting apparatuses 1, and a reflow apparatus and a substrate inspection apparatus are provided on the downstream side (arrow X2 direction side), for example.

The substrate working system 100 includes a conveyance controller 4 and a communicator 5. The conveyance controller 4 and the communicator 5 are disposed in the component storage 2, for example. The conveyance controller 4 includes a CPU (Central Processing Unit) and a memory, and controls each portion of the substrate working system 100 by executing a program stored in the memory. The conveyance controller 4 is an example of a "controller" in the claims.

The communicator 5 can perform wireless communication between the conveyance controller 4 and the unmanned aerial vehicle 3 and between the conveyance controller 4 and each component mounting apparatus 1. The conveyance controller 4 acquires necessary article information from each component mounting apparatus 1 via the communicator 5, and transmits a conveyance command signal to the unmanned aerial vehicle 3.

In the present embodiment, the unmanned aerial vehicle 3 conveys the conveyance article 20 by flying from the component storage 2 to the placement portion 11 of the component mounting apparatus 1 while holding the conveyance article 20 based on the necessary article information of the component mounting apparatus 1.

Figure 3:
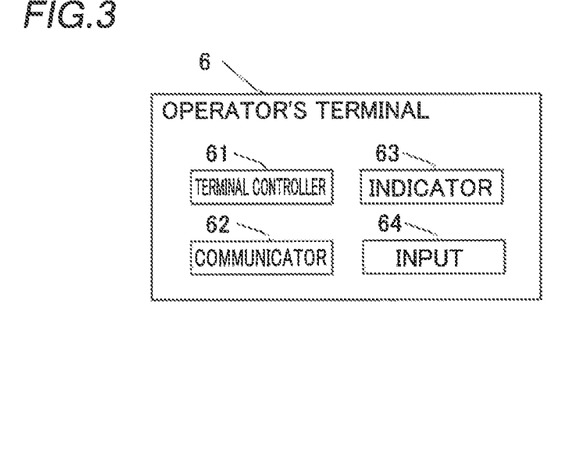
FIG. 3 is a block diagram showing the structure of an operator's terminal of the substrate working system according to the embodiment of the present disclosure.

The substrate working system 100 includes an operator's terminal 6 carried by the operator and capable of communicating with the conveyance controller 4. As shown in FIG. 3, the operator's terminal 6 includes a terminal controller 61, a communicator 62, an indicator 63, and an input 64. The terminal controller 61 controls each portion of the operator's terminal 6. The communicator 62 can perform wireless communication with the conveyance controller 4 and the unmanned aerial vehicle 3. The indicator 63 outputs an indication that conveyance of the conveyance article 20 has been completed based on a conveyance completion signal from the unmanned aerial vehicle 3, for example. The input 64 receives an input operation from the operator.

(Structure of Component Storage)

The component storage 2 includes a shelf or a warehouse, for example, and stores reels 21 and a plurality of devices 22 used in the component mounting apparatuses 1, as shown in FIG. 2. In addition, the component storage 2 is spaced apart from the component mounting apparatuses 1. For example, the component storage 2 is disposed on the arrow Y1 direction side relative to the mounting lines 10 in the plurality of rows.

Figure 4:
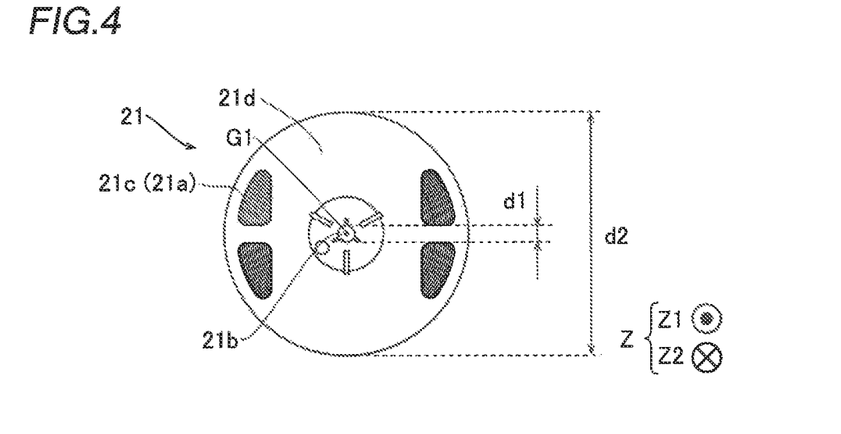
FIG. 4 is a plan view showing the structure of a reel of the substrate working system according to the embodiment of the present disclosure.

In the present embodiment, as shown in FIG. 4, the reels 21 each include a through-hole 21b provided in the vicinity of the position of the center of gravity G1 in a plan view (as viewed from the arrow Z1 direction side) and through which a shaft member 37 described below passes, and store the components 21a to be mounted on the substrate P. Specifically, the reels 21 each include a tape 21c on which a plurality of components 21a are stored at a predetermined interval, and a case 21d around which the tape 21c is wound. The through-hole 21b has a diameter d1, and is provided in the vicinity of the position of the center of gravity G1 of the case 21d. The reels 21 each have a diameter d2. The components 21a include electronic components such as ICs, transistors, capacitors, and resistors.

Figure 5:
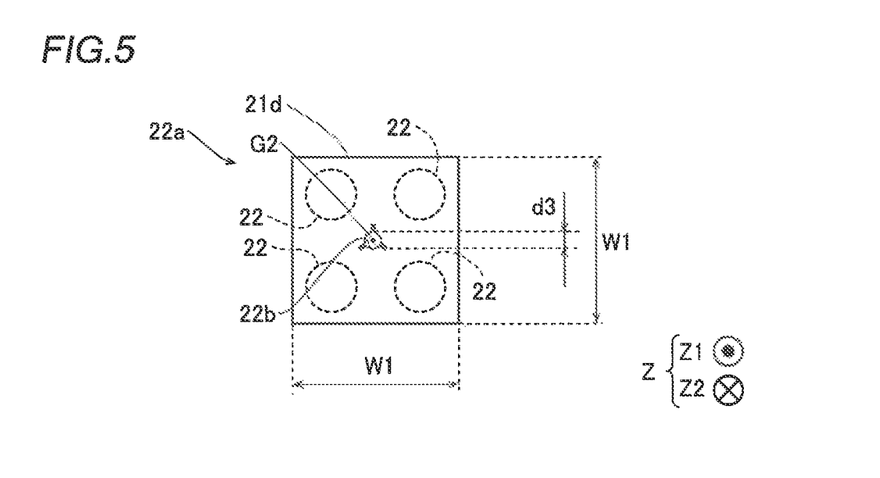
FIG. 5 is a plan view showing the structure of a storage box of the substrate working system according to the embodiment of the present disclosure.

The devices 22 include at least one of nozzles, nozzle stations in which a plurality of nozzles are stored, tray components, solder, adhesives, grease, and repair members, for example. For example, as shown in FIG. 5, the devices 22 are stored in a storage box 22a.

The storage box 22a is provided in the vicinity of the position of the center of gravity G2 as viewed from the arrow Z1 direction side, and includes a through-hole 22b through which the shaft member 37 described below passes. The through-hole 22b has a diameter d3. Furthermore, the storage box 22a has a rectangular shape as viewed from the arrow Z1 direction side, for example, and has a width W1 in a direction parallel to the X-axis and in a direction parallel to the Y-axis. The devices 22 are preferably stored in the storage box 22a such that the position of the center of gravity of the storage box 22a does not move from the position of the center of gravity G2. When the plurality of devices 22 are stored in the storage box 22a, for example, the same are disposed at positions point-symmetric with respect to the position of the center of gravity G2 in the plan view (as viewed from the arrow Z1 direction side).

Figure 6:
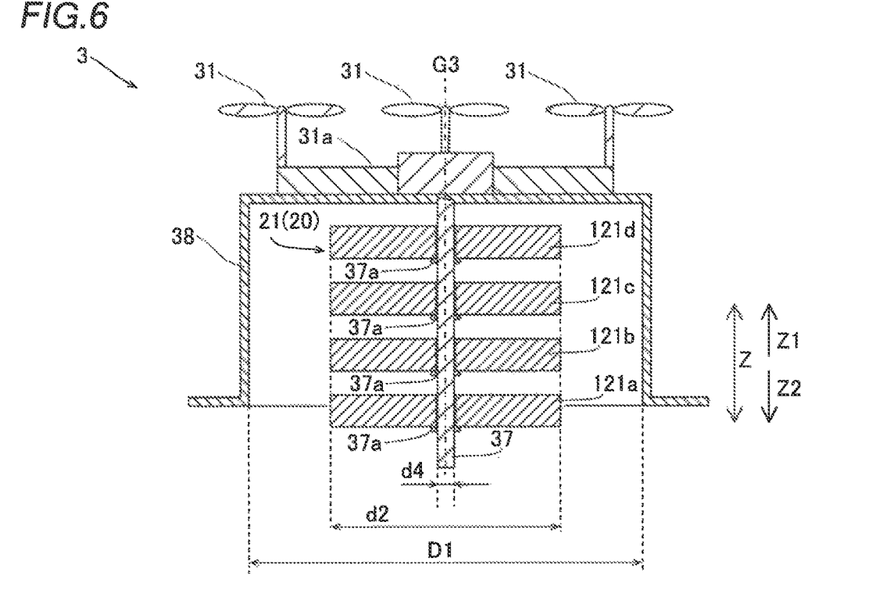
FIG. 6 is a sectional view schematically showing the structure of the unmanned aerial vehicle of the substrate working system according to the embodiment of the present disclosure.

As shown in FIG. 6, the components 21a in the states of the reels 21 are conveyed by the unmanned aerial vehicle 3. Furthermore, the devices 22 stored in the storage box 22a are conveyed by the unmanned aerial vehicle 3. In the following description, the devices 22 (storage box 22a) and the components 21a (reels 21) are described as the "conveyance article 20" unless otherwise distinguished.

Figure 7:
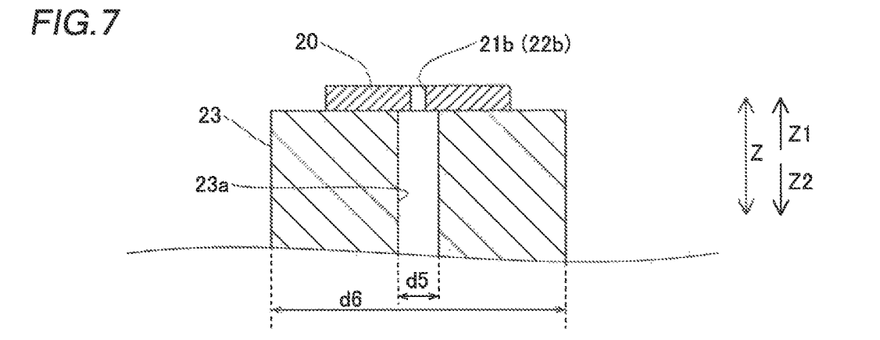
FIG. 7 is a sectional view schematically showing the structure of an article placement table of the substrate working system according to the embodiment of the present disclosure.

As shown in FIG. 7, the component storage 2 includes an article placement table 23. The article placement table 23 includes a hole 23a having a diameter d5 larger than the diameter d4 of the shaft member 37. The conveyance article 20 is replaced on the article placement table 23 in a state in which the hole 23a and the through-hole 21b (22b) of the conveyance article 20 are disposed at positions at which the hole 23a and the through-hole 21b of the conveyance article 20 correspond to each other. The article placement table 23 has a diameter d6, for example, and has a function of guiding the unmanned aerial vehicle 3 in a state in which the article placement table 23 is disposed inside a guide 38, described below, of the unmanned aerial vehicle 3. Note that the operation of placing the conveyance article 20 on the article placement table 23 may be automatically performed under control of the conveyance controller 4 or may be performed by the operator.

(Structure of Component Mounting Apparatus)

Figure 8:
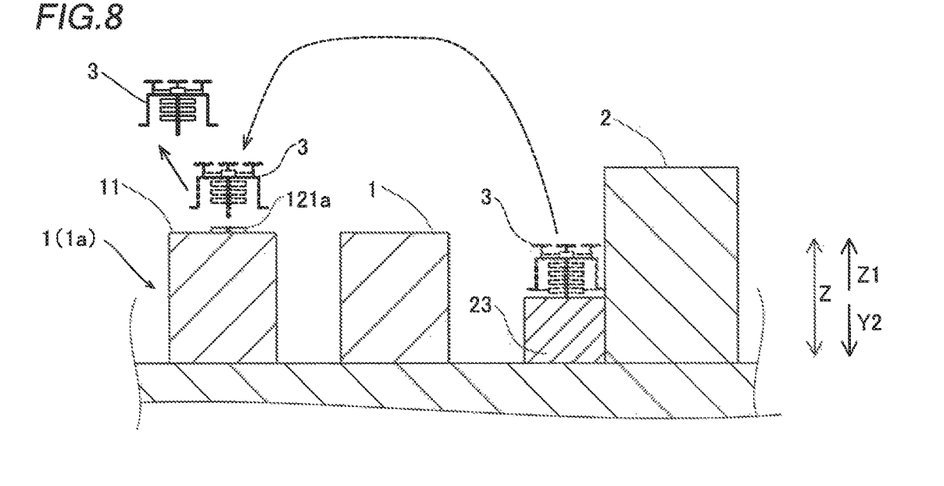
FIG. 8 is a diagram illustrating conveyance by the unmanned aerial vehicle of the substrate working system according to the embodiment of the present disclosure.

For example, as shown in FIG. 8, the placement portion 11 is provided on the upper surface (a surface on the arrow Z1 direction side) of a housing of each of the plurality of component mounting apparatuses 1. Furthermore, the placement portion 11 is a flat surface, for example, and may include a mark or the like that can be detected by the unmanned aerial vehicle 3.

Figure 9:
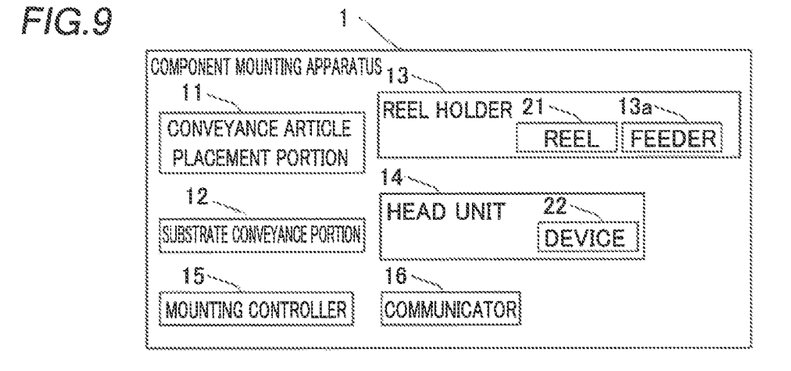
FIG. 9 is a block diagram showing the structure of a component mounting apparatus of the structure working system according to the embodiment of the present disclosure.

As shown in FIG. 9, the plurality of component mounting apparatuses 1 include substrate conveyance portions 12 (conveyors, for example) that convey the substrate P. In each of the mounting lines 10, each component mounting apparatus 1 mounts the components 21a on the substrate P, and delivers the substrate P between a plurality of substrate conveyance portions 12 in the conveyance direction. The component mounting apparatus 1 includes a reel holder 13, a head unit 14, a mounting controller 15, and a communicator 16.

The reel holder 13 is a carriage that holds a plurality of reels 21, for example. The reel holder 13 includes a plurality of feeders 13a, and the feeders 13a hold tapes that extend from the reels 21. Furthermore, the feeders 13a supply the components 21a from the tips of the feeders 13a by rotating the reels 21 and sending out the tapes that hold the components 21a. The operation of disposing, on the reel holder 13, the reels 21 placed on the placement portion 11 is performed by the operator, for example. When the reels 21 are disposed in the reel holder 13 (the reels 21 are replaced), automatic splicing/auto-loading may be performed regardless of the operator.

A plurality of nozzles (devices 22) are attached to the head unit 14. The head unit 14 acquires the components 21a from the feeders 13a via the nozzles based on a command from the mounting controller 15, and mounts the components 21a on the substrate P held by a substrate conveyance portion 12. Furthermore, the plurality of nozzles of the head unit 14 are replaced when the setup of the component mounting apparatus 1 is changed (the type of the substrate P is changed), for example.

The mounting controller 15 includes a CPU and a memory, for example, and controls each portion of the component mounting apparatus 1 by executing a program stored in the memory. The communicator 16 can perform wireless communication with the conveyance controller 4. In the present embodiment, the mounting controller 15 transmits the necessary article information to the conveyance controller 4 via the communicator 16. Note that the mounting controller 15 may repetitively (constantly) transmit the necessary article information to the conveyance controller 4, or may transmit the necessary article information only when conveyance of the conveyance article 20 is requested.

The necessary article information includes the type and number of necessary reels 21 (components 21a) and the type and number of necessary devices 22, for example. In addition, the necessary article information includes at least one of information (information indicating the progress status of mounting) indicating the remaining number of components 21a of each reel 21 held in the component mounting apparatus 1, the required number of components 21a for the substrate P that is planned to be produced, and information indicating the relationship between the required number of components 21a and time at which the number is required. For example, when the reel 21 is replaced, the information indicating the remaining number of components 21a of the necessary article information is updated.

(Structure of Unmanned Aerial Vehicle)

As shown in FIG. 8, in the present embodiment, the unmanned aerial vehicle 3 autonomously flies, i.e. the unmanned aerial vehicle 3 flies while being automatically operated. The unmanned aerial vehicle 3 autonomously flies and conveys the plurality of reels 21 and the plurality of devices 22 to the placement portion 11. The devices 22 are conveyed in a state in which the devices 22 are stored in the storage box 22a that can be held by the unmanned aerial vehicle 3.

Figure 10:
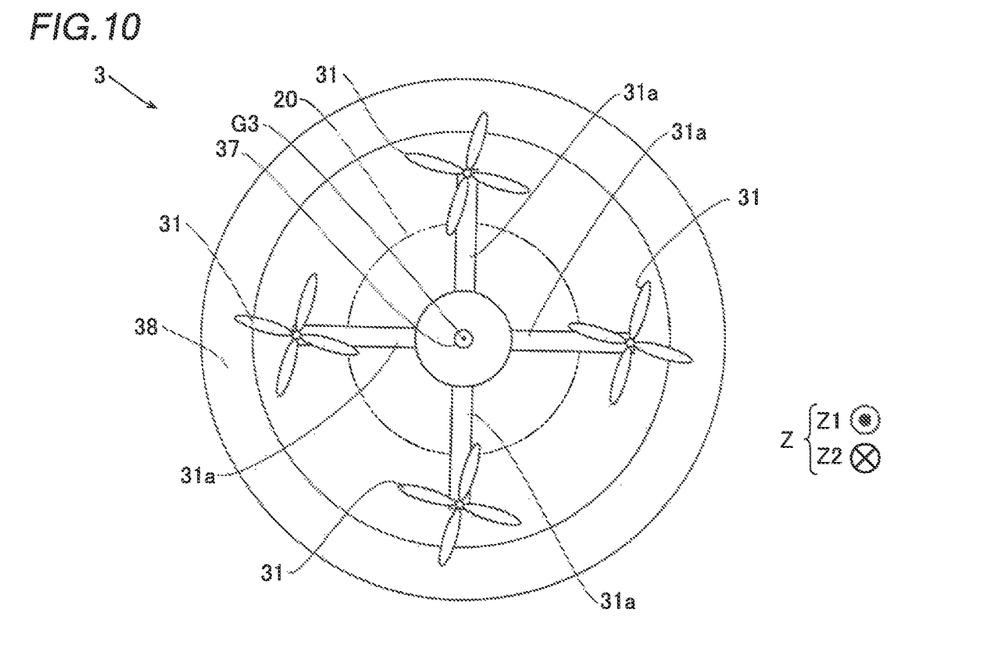
FIG. 10 is a plan view schematically showing the structure of the unmanned aerial vehicle of the substrate working system according to the embodiment of the present disclosure.

As shown in FIG. 10, the unmanned aerial vehicle 3 includes a plurality of (four, for example) rotating blades 31 (propellers). The unmanned aerial vehicle 3 flies by rotating the plurality of rotating blades 31. For example, the unmanned aerial vehicle 3 can take off and land, hover to stay in the air, and vertically and horizontally move (fly) in the air by rotating the plurality of rotating blades 31.

The plurality of rotating blades 31 are equidistantly spaced apart from the position of the center of gravity G3 of the unmanned aerial vehicle 3. The plurality of rotating blades 31 are supported by supports 31a of the rotating blades 31.

Figure 11:
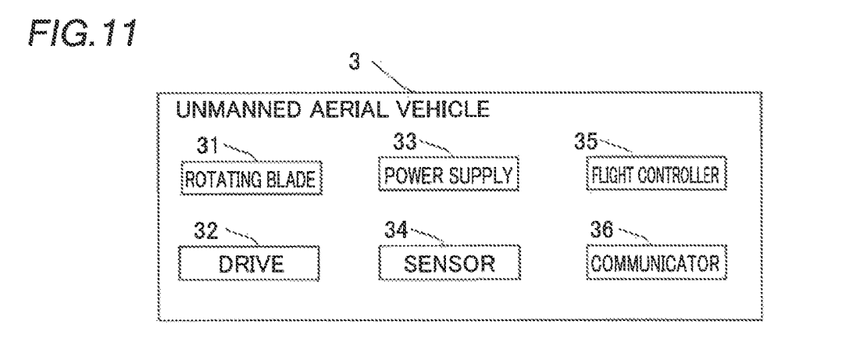
FIG. 11 is a block diagram showing the structure of the unmanned aerial vehicle of the substrate working system according to the embodiment of the present disclosure.

As shown in FIG. 11, the unmanned aerial vehicle 3 includes a drive 32 that rotates the rotating blades 31, a power supply 33 that supplies electric power to the drive 32, a sensor 34, and a flight controller 35 that controls driving of the drive 32, and a communicator 36 capable of wireless communication. The flight controller 35 is an example of a "controller" in the claims.

The drive 32 includes a motor (electric motor), for example. The drive 32 individually rotates the plurality of rotating blades 31 using the electric power from the power supply 33 based on a command from the flight controller 35.

The sensor 34 includes a pose sensor, a position sensor, and an obstacle detection sensor, for example. The sensor 34 includes an angular velocity sensor and an acceleration sensor as the pose sensor, a GPS (Global Positioning System) sensor as the position sensor, and an imaging sensor (such as a CCD camera) as the obstacle detection sensor, for example. The unmanned aerial vehicle 3 acquires pose information, position information, obstacle information, etc. of the unmanned aerial vehicle 3 with the sensor 34.

The flight controller 35 includes a CPU and a memory, and controls each portion of the unmanned aerial vehicle 3 by executing a program stored in the memory. The flight controller 35 controls driving of the drive 32 based on the information acquired by the sensor 34 so as to control the unmanned aerial vehicle 3 to autonomously fly.

In the present embodiment, the flight controller 35 acquires the conveyance command signal from the conveyance controller 4 via the communicator 36, and performs control of determining a flight path based on the acquired conveyance command signal. The flight path is an example of a "conveyance path" in the claims.

Specifically, in the present embodiment, the flight controller 35 performs control of determining a flight path (a flight path B1 in FIG. 2, for example) along which the unmanned aerial vehicle 3 conveys the conveyance article 20 in an area other than a flight prohibited area A1 and in a flight area A2 based on the arrangement positions of the component mounting apparatuses 1 (the arrangement positions of the mounting lines 10 set (stored) in advance in the memory of the flight controller 35.

More specifically, as shown in FIG. 2, the flight prohibited area A1 is the vicinity A11 of a support pillar of the factory 100a and the vicinity A12 of a wall of the factory 100a, for example. Although not shown, when the component mounting apparatuses 1 are wired from the ceiling, the wiring positions are set in advance as the flight prohibited area A1. Furthermore, the flight area A2 is the vicinity A21 of the arrangement position of the component storage 2, the vicinities A22 of the arrangement positions of the mounting lines 10, and an area A23 between the component storage 2 and the mounting lines 10, for example.

For example, it is assumed that the flight controller 35 has acquired the conveyance command signal indicating that the conveyance article 20 is conveyed to each of the four component mounting apparatuses 1 (a first component mounting apparatus 1a to a fourth component mounting apparatus 1d) as the component mounting apparatuses 1 based on the conveyance command signal from the conveyance controller 4. In this case, the flight controller 35 performs control of determining the flight path B1 based on the current position (the position of the component storage 2), the positions of the four component mounting apparatuses 1, the flight prohibited area A1, and the flight area A2.

When acquiring the conveyance command signal from the conveyance controller 4, the flight controller 35 performs control of holding the conveyance article 20 based on the conveyance command signal. For example, the flight controller 35 controls the unmanned aerial vehicle 3 to move to the article placement table 23 disposed on the component storage 2 and to hold the conveyance article 20 placed on the article placement table 23.

Here, as shown in FIG. 6, in the present embodiment, the unmanned aerial vehicle 3 extends along the vertical direction (arrow Z2 direction) from the vicinity of the position of the center of gravity G3 of the unmanned aerial vehicle 3 in the plan view, and includes the shaft member 37 that holds the conveyance article 20. In the present specification, "the position of the center of gravity G1", "the position of the center of gravity G2", and "the position of the center of gravity G3" represent the geometric position of the center of gravity.

Specifically, the shaft member 37 has a columnar shape that extends so as to protrude from the lower sides (arrow Z2 direction sides) of the supports 31a that support the rotating blades 31. The diameter d4 of the shaft member 37 is smaller than the diameter d1 of the through-hole 21b of the reel 21 and the diameter d3 of the through-hole 22b of the storage box 22a. Thus, the shaft member 37 can be inserted into the through-hole 21b of the reel 21 and the through-hole 22b of the storage box 22a.

Furthermore, the shaft member 37 includes attachable/detachable portions 37a that can individually hold a plurality of conveyance articles 20 and can individually release the holding. The attachable/detachable portions 37a are protrusions that protrude in a direction perpendicular to a direction (a direction parallel to a Z-axis) in which the shaft member 37 extends from the shaft member 37, for example. Furthermore, the attachable/detachable portions 37a switch between a state of protruding from the shaft member 37 and a state of being stored in the shaft member 37 (a state of not protruding) under control of the flight controller 35.

Figure 12:
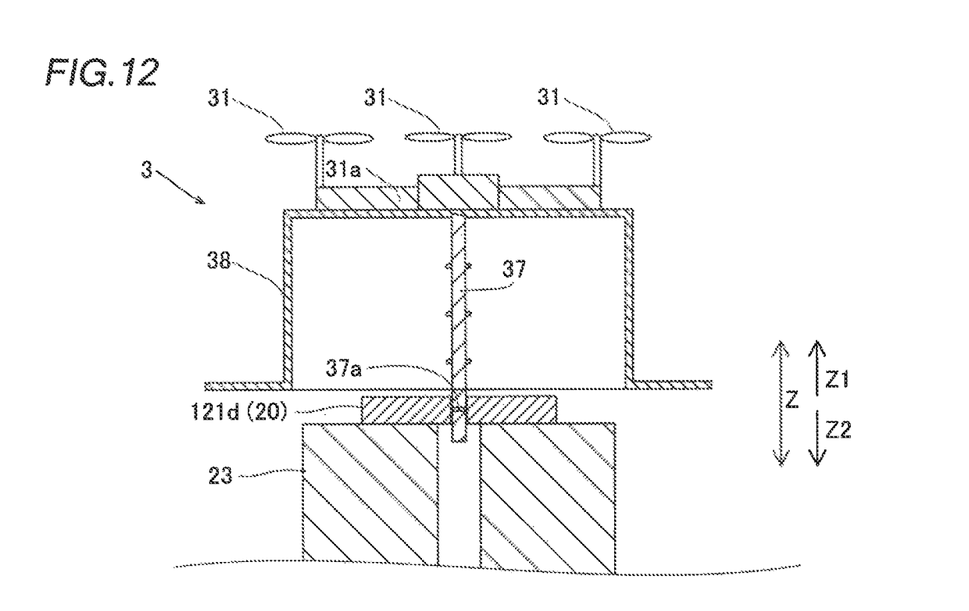
FIG. 12 is a diagram illustrating the structure of the unmanned aerial vehicle that holds a first conveyance article in the substrate working system according to the embodiment of the present disclosure.
Figure 13:
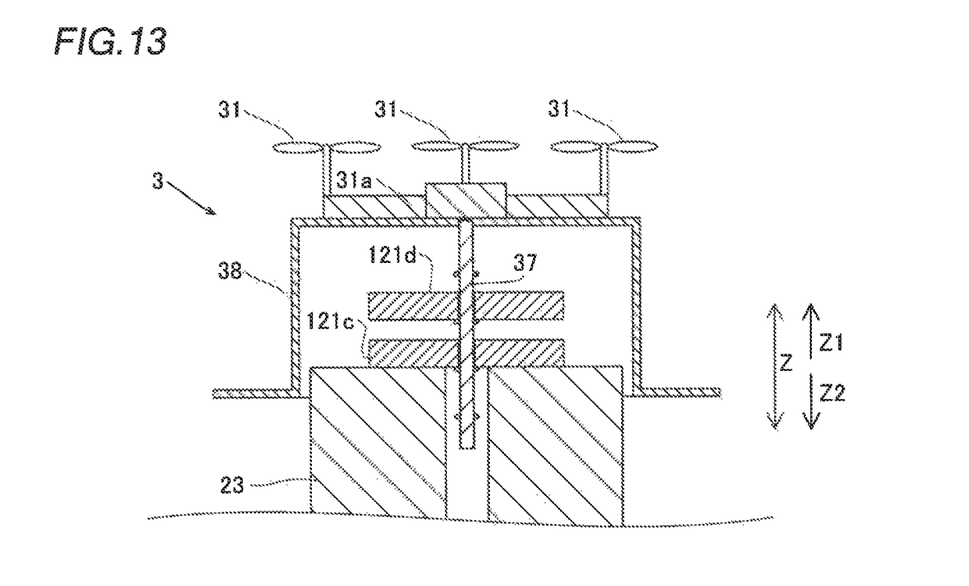
FIG. 13 is a diagram illustrating the structure of the unmanned aerial vehicle that holds a second conveyance article in the substrate working system according to the embodiment of the present disclosure.

As shown in FIG. 12, the shaft member 37 is inserted into and passes through the through-hole 21b (or the through-hole 22b of the storage box 22a) of the reel 21 in a state in which the attachable/detachable portions 37a are stored in the shaft member 37, and the attachable/detachable portions 37a protrude in a state in which the shaft member 37 passes through the through-hole 21b such that the shaft member 37 holds the reel 21 (or the storage box 22a) without detachment therefrom. That is, the shaft member 37 holds the conveyance article 20 in a skewered state.

The unmanned aerial vehicle 3 includes the guide 38 that guides movement of the unmanned aerial vehicle 3 when holding the conveyance article 20. The guide 38 has a bowl shape opened to the arrow Z2 direction side, and a distance D1 between the inner side surfaces (see FIG. 6) is approximately the diameter d6 of the article placement table 23 and is larger than the diameter d6. Furthermore, the position of the center of gravity of the guide 38 substantially coincides with the position of the center of gravity G3, and the guide 38 and the article placement table 23 are fitted into each other such that alignment between the shaft member 37 and the through-hole 21b of the reel 21 is performed.

The guide 38 covers the outside (the outside relative to the position of the center of gravity G3) of the conveyance article 20 in a state in which the unmanned aerial vehicle 3 holds the conveyance article 20.

In the present embodiment, the shaft member 37 of the unmanned aerial vehicle 3 holds the plurality of conveyance articles 20 in the reverse order of the order of conveying the plurality of conveyance articles 20. For example, the flight controller 35 of the unmanned aerial vehicle 3 performs control of holding a fourth reel 121d, a third reel 121c, a second reel 121b, and a first reel 121a in this order, which is the reverse order of the conveyance order, when acquiring the conveyance command signal indicating that the first reel 121a, the second reel 121b, the third reel 121c, and the fourth reel 121d are conveyed in this order and transmitted from the conveyance controller 4. For example, as shown in FIG. 6, the unmanned aerial vehicle 3 holds the fourth reel 121d, the third reel 121c, the second reel 121b, and the first reel 121a in this order from the arrow Z1 direction side of the shaft member 37 to the arrow Z2 direction side thereof.

Figure 14:
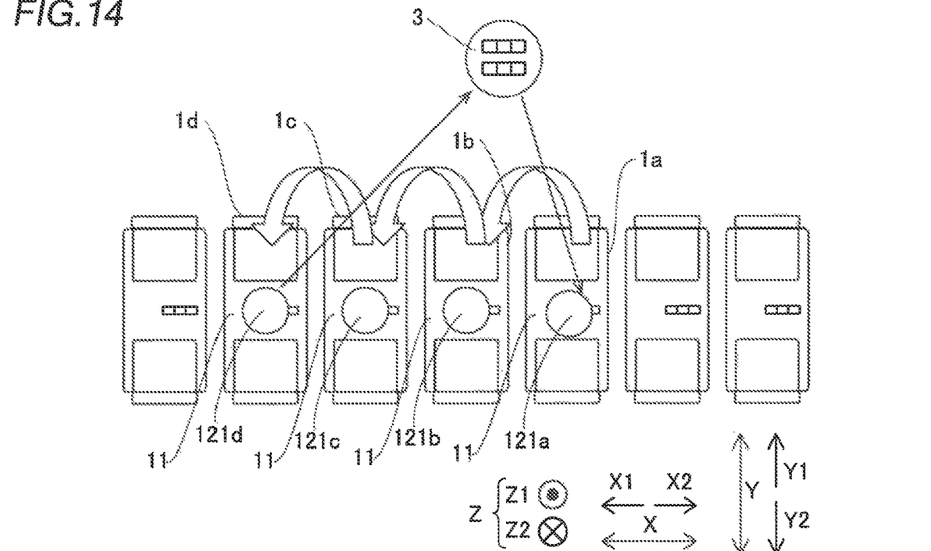
FIG. 14 is a diagram illustrating the order of conveyance by the unmanned aerial vehicle in the substrate working system according to the embodiment of the present disclosure.

Then, as shown in FIG. 8, the unmanned aerial vehicle 3 conveys the first reel 121a to the first component mounting apparatus 1a corresponding to the conveyance command signal, releases holding of the first reel 121a, and places the first reel 121a on the placement portion 11 of the first component mounting apparatus 1a. Thereafter, as shown in FIG. 14, the unmanned aerial vehicle 3 conveys the second reel 121b, the third reel 121c, and the fourth reel 121d in this order, and releases the holding.

Then, when conveyance of the conveyance article 20 has been completed, the flight controller 35 transmits the conveyance completion signal to the operator's terminal 6 (and the conveyance controller 4). Then, the indicator 63 of the operator's terminal 6 outputs an indication that the conveyance of the conveyance article 20 has been completed.

(Structure of Conveyance Controller)

In the present embodiment, the conveyance controller 4 controls the unmanned aerial vehicle 3 in a state of holding the conveyance article 20 to autonomously fly from the component storage 2 to the placement portion 11 based on the necessary article information. Furthermore, in the present embodiment, the conveyance controller 4 acquires the degrees of request in which the plurality of component mounting apparatuses 1 request the conveyance articles 20 based on the necessary article information of the plurality of component mounting apparatuses 1, and controls the unmanned aerial vehicle 3 to preferentially convey the conveyance article 20 with a higher degree of request.

Specifically, the conveyance controller 4 acquires the necessary article information from each of the plurality of component mounting apparatuses 1. For example, the conveyance controller 4 acquires the remaining number of components 21a in the component mounting apparatus 1, the required number of components 21a for the substrate P that is planned to be produced, and the information indicating the relationship between the required number of components 21a and time at which the number is required based on the necessary article information, and acquires the degree of request in which the conveyance article 20 is requested. For example, the conveyance controller 4 performs control of setting the degree of request of the conveyance article 20 to be conveyed to the component mounting apparatus 1 that runs short of the components 21a earliest from the present time as the highest degree of request.

Then, the conveyance controller 4 performs control of transmitting, to the unmanned aerial vehicle 3, the conveyance command signal indicating that the unmanned aerial vehicle 3 conveys the conveyance article 20 to the placement portion 11 of the component mounting apparatus 1 in the order from the conveyance article 20 with a higher degree of request to the conveyance article 20 with a lower degree of request. For example, when the degrees of request of the first reel 121a to the fourth reel 121d are higher in this order, the unmanned aerial vehicle 3 holds the fourth reel 121d to the first reel 121a in this order as in examples shown in FIGS. 6 and 14 described above, and conveys the first reel 121a to the fourth reel 121d in this order to the placement portions 11 of the component mounting apparatuses 1. Thus, the first reel 121a with a higher degree of request is conveyed preferentially over the second reel 121b to the fourth reel 121d.

The conveyance controller 4 controls the unmanned aerial vehicle 3 to convey the conveyance article 20 based on the necessary article information from the operator's terminal 6. For example, when the operator inputs the necessary article information into the input 64 of the operator's terminal 6, the operator's terminal 6 transmits the necessary article information to the conveyance controller 4. The conveyance controller 4 controls the unmanned aerial vehicle 3 to convey the conveyance article 20 based on the necessary article information to the placement portion 11.

[Method for Conveying Component]

Figure 15:
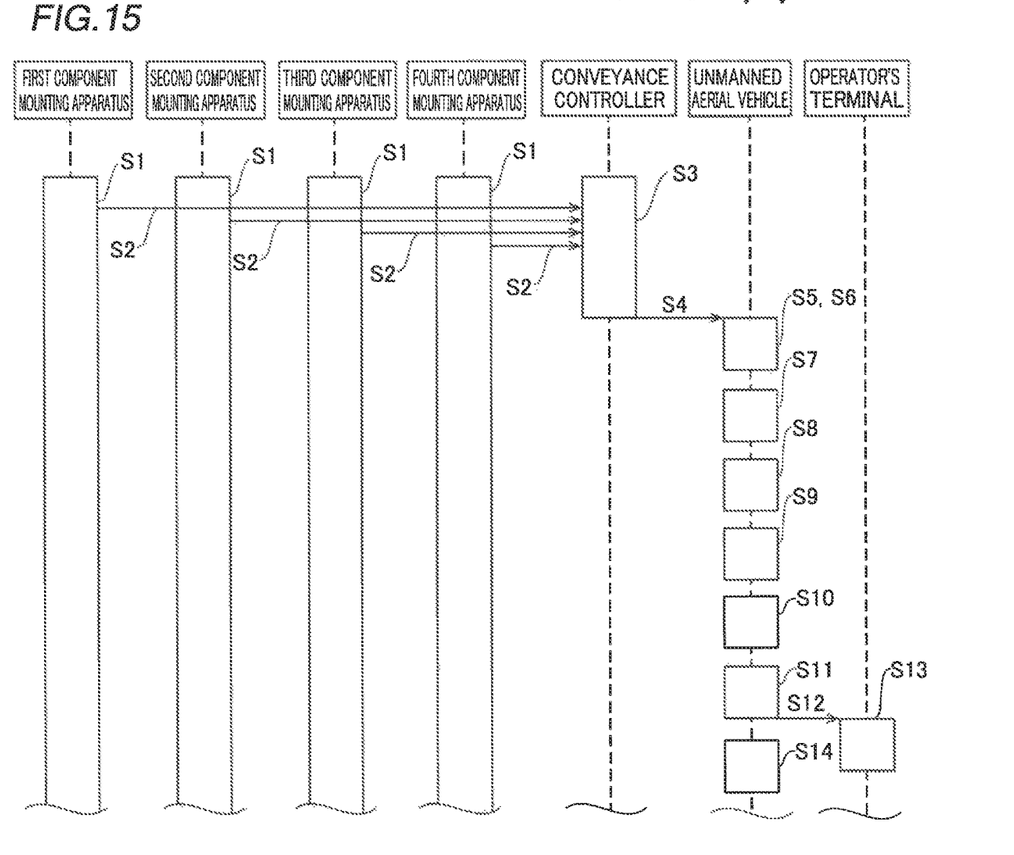
FIG. 15 is a sequence diagram illustrating control processing and signal exchange in the substrate working system according to the embodiment of the present disclosure.

A method for conveying a component by the substrate working system 100 according to the present embodiment is now described with reference to FIG. 15.

The method for conveying a component by the substrate working system 100 according to the present embodiment is a method for conveying a component in the substrate working system 100 in which the necessary article information is acquired from the plurality of component mounting apparatuses 1, and the unmanned aerial vehicle 3 conveys the conveyance article 20 by flying from the component storage 2 spaced apart from the plurality of component mounting apparatuses 1 and that stores at least one of the devices 22 and the components 21a to be used by the component mounting apparatus 1 to the placement portion 11 of the component mounting apparatus 1 based on the necessary article information while holding the conveyance article 20 including at least one of the devices 22 and the components 21a based on the necessary article information. As a specific example, an example of conveying the first reel 121a to the fourth reel 121d to the first component mounting apparatus 1a to the fourth component mounting apparatus 1d is now described below.

Control processing of the first component mounting apparatus 1a to the fourth component mounting apparatus 1d is executed by the mounting controller 15 of each of the first component mounting apparatus 1a to the fourth component mounting apparatus 1d. Furthermore, control processing of the unmanned aerial vehicle 3 is executed by the flight controller 35.

First, in step S1, the components 21a are mounted on the substrate P by the first component mounting apparatus 1a to the fourth component mounting apparatus 1d. In step S2, the necessary article information is transmitted from the first component mounting apparatus 1a to the fourth component mounting apparatus 1d to the conveyance controller 4. The timing of transmitting the necessary article information is not limited to the timing in step S2 shown in FIG. 15, but the necessary article information may be transmitted from the first component mounting apparatus 1a to the fourth component mounting apparatus 1d to the conveyance controller 4 as needed. Thereafter, the processing advances to step S3.

Then, in step S3, the degree of request is acquired based on the necessary article information acquired by the conveyance controller 4. For example, the degrees of request are acquired in a state in which the degrees of request of the first reel 121a that needs to be conveyed to the first component mounting apparatus 1a, the second reel 121b that needs to be conveyed to the second component mounting apparatus 1b, the third reel 121c that needs to be conveyed to the third component mounting apparatus 1c, and the fourth reel 121d that needs to be conveyed to the fourth component mounting apparatus 1d are higher in this order. Thereafter, the processing advances to step S4.

Then, in step S4, the conveyance command signal is transmitted from the conveyance controller 4 to the unmanned aerial vehicle 3. For example, the conveyance command signal indicating that the first reel 121a, the second reel 121b, the third reel 121c, and the fourth reel 121d are conveyed in this order to the first component mounting apparatus 1a, the second component mounting apparatus 1b, the third component mounting apparatus 1c, and the fourth component mounting apparatus 1d, respectively, is transmitted from the conveyance controller 4 to the unmanned aerial vehicle 3. Thereafter, the processing advances to step S5 and step S6.

Then, in step S5, the fourth reel 121d, the third reel 121c, the second reel 121b, and the first reel 121a are held in this order (in the reverse order of the conveyance order) by the unmanned aerial vehicle 3.

In step S6, the unmanned aerial vehicle 3 determines the flight path B1 in the area other than the flight prohibited area A1 and in the flight area A2 based on the conveyance command signal. Thereafter, the processing advances to step S7.

In step S7, the unmanned aerial vehicle 3 is flown along the flight path B1 in a state in which the unmanned aerial vehicle 3 holds the first reel 121a to the fourth reel 121d. Then, the proceeding advances to step S8.

In step S8, the unmanned aerial vehicle 3 arrives at the placement portion 11 of the first component mounting apparatus 1a, releases holding of the first reel 121a, and places the first reel 121a on the placement portion 11. That is, the first reel 121a with the highest degree of request is conveyed preferentially over the remaining reels 21.

Thereafter, in step S9, the unmanned aerial vehicle 3 arrives at the placement portion 11 of the second component mounting apparatus 1b, releases holding of the second reel 121b, and places the second reel 121b on the placement portion 11. Thereafter, in step S10, the unmanned aerial vehicle 3 arrives at the placement portion 11 of the third component mounting apparatus 1c, releases holding of the third reel 121c, and places the third reel 121c on the placement portion 11. Thereafter, in step S11, the unmanned aerial vehicle 3 arrives at the placement portion 11 of the fourth component mounting apparatus 1d, releases holding of the fourth reel 121d, and places the fourth reel 121d on the placement portion 11. Thereafter, the processing advances to step S12.

Then, in step S12, the conveyance completion signal is transmitted from the unmanned aerial vehicle 3 to the operator's terminal 6. Thereafter, in step S13, the indicator 63 of the operator's terminal 6 outputs an indication that conveyance by the unmanned aerial vehicle 3 has been completed. Then, the operator replaces the first reel 121a to the fourth reel 121d. After step S12, in step S14, the unmanned aerial vehicle 3 flies and returns to the component storage 2.

Then, control processing similar to step S1 to step S14 described above is performed between each of the plurality of component mounting apparatuses 1, the unmanned aerial vehicle 3, the conveyance controller 4, and the operator's terminal 6 such that the substrate work of mounting the components 21a on the substrate P progresses.

Advantageous Effects of Present Embodiment

According to the present embodiment, the following advantageous effects are achieved.

According to the present embodiment, the substrate working system 100 includes the unmanned aerial vehicle 3 that conveys the conveyance article 20 by flying from the component storage 2 to the placement portion 11 of the predetermined component mounting apparatus 1 while holding the conveyance article 20 including at least one of the devices 22 and the components 21a based on the necessary article information of the component mounting apparatus 1. Accordingly, the operator does not need to move and convey the devices 22 and the components 21a from the component storage 2 to the predetermined component mounting apparatus 1, and thus the work burden on the operator can be reduced. Furthermore, the unmanned aerial vehicle 3 can fly so as to move over the component mounting apparatuses 1. Consequently, the unmanned aerial vehicle 3 can convey the conveyance article 20 at the shortest distance from the component storage 2 to the predetermined component mounting apparatus 1 by flying over the plurality of component mounting apparatuses 1 without bypassing the plurality of component mounting apparatuses 1 on the ground, and thus the time required to convey the conveyance article 20 can be reduced. Accordingly, the time during which the component mounting apparatus 1 is stopped due to the shortage of the components 21a, for example, can be significantly reduced or prevented, and thus the substrate working system 100 can efficiently perform work on the substrate P.

Here, as the method for conveying the conveyance article 20 at a position higher than the component mounting apparatuses 1, it is conceivable to provide equipment such as a crane and a pneumatic dispatch tube system in the substrate working system. However, the equipment such as a crane and a pneumatic dispatch tube system is large-sized, and there is a disadvantage that substrate working equipment is increased in size. Furthermore, when a crane, a pneumatic dispatch tube system, or the like is provided, it is necessary to reconstruct the structure of the crane, the pneumatic dispatch tube system, or the like when changing the arrangement positions (the structure of the mounting lines 10) of the component mounting apparatuses 1, and thus there is a disadvantage that it is difficult to change the structure of the mounting lines 10. Regarding this point, in the present embodiment, the unmanned aerial vehicle 3 flies to convey the conveyance article 20, and thus even when the structure of the mounting lines 10 is changed, the conveyance article 20 can be conveyed without changing the equipment but by changing the flight path of the unmanned aerial vehicle 3 that conveys the conveyance article 20.

Furthermore, instead of conveying the conveyance article 20 by the operator, a method for conveying the conveyance article 20 using a self-propelled carrier is conceivable.

However, the carriage moves along the ground (floor), and thus the carriage needs to move from the component storage 2 while bypassing the plurality (several tens, for example) of component mounting apparatuses 1. Therefore, the time required to convey the conveyance article 20 increases. In this regard, in the present embodiment, the unmanned aerial vehicle 3 flies to convey the conveyance article 20, and thus the unmanned aerial vehicle 3 can convey the conveyance article 20 at the shortest distance without bypassing the component mounting apparatuses 1 on the ground. Consequently, the time required to convey the conveyance article 20 can be reduced.

According to the present embodiment, the substrate working system 100 includes the conveyance controller 4 that acquires the necessary article information from the plurality of component mounting apparatuses 1. Furthermore, the unmanned aerial vehicle 3 conveys the conveyance article 20 based on the necessary article information acquired by the conveyance controller 4. Accordingly, the conveyance article 20 based on the necessary article information can be conveyed by the unmanned aerial vehicle 3, and thus an appropriate conveyance article 20 can be easily conveyed to the component mounting apparatus 1.

According to the present embodiment, the unmanned aerial vehicle 3 performs autonomous flight to fly while being automatically operated. Furthermore, the conveyance controller 4 controls the unmanned aerial vehicle 3 in a state of holding the conveyance article 20 to autonomously fly from the component storage 2 to the placement portion 11 based on the necessary article information. Accordingly, the operator does not need to operate the unmanned aerial vehicle 3 with a remote controller or the like, and thus the work burden on the operator can be effectively reduced.

According to the present embodiment, the conveyance controller 4 acquires the degrees of request in which the plurality of component mounting apparatuses 1 request the conveyance articles 20 based on the necessary article information of the plurality of component mounting apparatuses 1, and controls the unmanned aerial vehicle 3 to preferentially convey the conveyance article 20 with a higher degree of request. Accordingly, the conveyance article 20 with a higher degree of request can be quickly conveyed. Furthermore, as in the present embodiment, the degree of request of the conveyance article 20 to be conveyed to the component mounting apparatus 1 that runs short of the components 21a is increased such that the conveyance article 20 can be quickly conveyed to the component mounting apparatus 1 that runs short of the components 21a, and thus stopping of the work due to the component shortage of the component mounting apparatus 1 can be effectively significantly reduced or prevented. Furthermore, even when the work stops, an increase in downtime can be minimized.

According to the present embodiment, the unmanned aerial vehicle 3 holds the plurality of conveyance articles 20. Furthermore, the conveyance controller 4 controls the unmanned aerial vehicle 3 to hold the plurality of conveyance articles 20 in the reverse order of the order in which the unmanned aerial vehicle 3 conveys the plurality of conveyance articles 20. Here, when the shaft member 37 is provided in the unmanned aerial vehicle 3 and the shaft member 37 passes through and holds the conveyance article 20, it is necessary to release the holding in the order reverse to the holding order. In consideration of this point, the substrate working system 100 is constructed as in the present embodiment such that holding of the conveyance article 20 can be released in the order of conveyance by the unmanned aerial vehicle 3, and thus when the conveyance articles 20 are sequentially conveyed to a plurality of locations and the release operation is performed, the operation of releasing the conveyance article 20 can be smoothly and efficiently performed.

According to the present embodiment, the flight controller 35 performs control of any of determining the flight path B1 along which the unmanned aerial vehicle 3 conveys the conveyance article 20 in the flight area A2 set in advance based on the arrangement positions of the component mounting apparatuses 1, and determining the flight path B1 in the area other than the flight prohibited area A1 set in advance. Accordingly, the flight area A2 or the flight prohibited area A1 (the position of an obstacle, for example) is set in advance, and thus it is easy to determine the flight path B1 along which the obstacle can be avoided when determining the flight path B1.

According to the present embodiment, the unmanned aerial vehicle 3 extends in the vertical direction (arrow Z2 direction) from the vicinity of the position of the center of gravity G3 of the unmanned aerial vehicle 3 in the plan view, and includes the shaft member 37 that holds the conveyance article 20. Accordingly, unlike the case in which the conveyance article 20 is held at a position away from the position of the center of gravity G3 of the unmanned aerial vehicle 3, deviation of the position of the center of gravity of the unmanned aerial vehicle 3 due to holding of the conveyance article 20 can be significantly reduced or prevented. Consequently, deviation of the position of the center of gravity of the unmanned aerial vehicle 3 is significantly reduced or prevented, and thus the unmanned aerial vehicle 3 can stably fly even when deviation of the position of the center of gravity is not considered.

According to the present embodiment, the conveyance article 20 includes the reel 21 including the through-hole 21b provided in the vicinity of the position of the center of gravity G1 in the plan view and through which the shaft member 37 passes, and that stores the components 21a to be mounted on the substrate P. Accordingly, the shaft member 37 passes through the reel 21 such that the reel 21 can be easily held by the shaft member 37 of the unmanned aerial vehicle 3.

According to the present embodiment, the upper surface of the predetermined component mounting apparatus 1 is set as the placement portion 11 for the conveyed conveyance article 20. Accordingly, the conveyance article 20 (the devices 22 and the components 21a) can be conveyed to a position in the vicinity of the predetermined component mounting apparatus 1 on which the operator performs the work, and thus the operator can quickly replace the devices 22 or the components 21a in the component mounting apparatus 1 after acquiring the conveyance article 20.

Modified Examples

The embodiment disclosed this time must be considered as illustrative in all points and not restrictive. The scope of the present disclosure is not shown by the above description of the embodiment but by the scope of claims for patent, and all modifications (modified examples) within the meaning and scope equivalent to the scope of claims for patent are further included.

For example, while the example in which the component mounting apparatus 1 is used as the substrate working apparatus according to the present disclosure has been shown in the aforementioned embodiment, the present disclosure is not restricted to this. That is, as the substrate working apparatus, a printer that prints solder or the like on the substrate P on which the components 21a are mounted may be used, or a reflow apparatus that heats solder and a substrate inspection apparatus that inspects the substrate P may be used.

While the example in which one unmanned aerial vehicle 3 is provided has been shown in the aforementioned embodiment, the present disclosure is not restricted to this. That is, a plurality of unmanned aerial vehicles 3 may be provided.

While the example in which the unmanned aerial vehicle 3 is autonomously flown has been shown in the aforementioned embodiment, the present disclosure is not restricted to this. For example, the unmanned aerial vehicle 3 may be flown by operation by the operator using a remote controller or the like.

While the example in which the unmanned aerial vehicle 3 automatically holds the conveyance article 20 has been shown in the aforementioned embodiment, the present disclosure is not restricted to this. That is, the conveyance article 20 may be attached to (detached from) the unmanned aerial vehicle 3 by the operator.

While the example in which the conveyance article 20 is conveyed to the placement portion 11 by the unmanned aerial vehicle 3 has been shown in the aforementioned embodiment, the present disclosure is not restricted to this. For example, the operator's terminal 6 may include a position sensor, and the conveyance article 20 may be conveyed to a position (the position of the operator's terminal 6) in the vicinity of the operator by the unmanned aerial vehicle 3.

While the example in which the unmanned aerial vehicle 3 conveys the four conveyance articles 20 has been shown in the aforementioned embodiment, the present disclosure is not restricted to this. For example, the unmanned aerial vehicle 3 may convey three or less conveyance articles 20, or may convey five or more conveyance articles 20.

While the example in which the conveyance article 20 is held by the shaft member 37 of the unmanned aerial vehicle 3 has been shown in the aforementioned embodiment, the present disclosure is not restricted to this. For example, the unmanned aerial vehicle 3 may include engaging portions (three claw-shaped members) that engage with the conveyance article 20, and the engaging portions may engage with the conveyance article 20 so as to hold the conveyance article 20.

While the example in which the conveyance controller 4 is provided separately from the flight controller 35 of the unmanned aerial vehicle 3 has been shown in the aforementioned embodiment, the present disclosure is not restricted to this. That is, the conveyance controller 4 and the flight controller 35 may be integral and unitary with each other, and may be disposed in the unmanned aerial vehicle 3 or the component storage 2.

While the example in which the flight controller 35 of the unmanned aerial vehicle 3 determines the flight path has been shown in the aforementioned embodiment, the present disclosure is not restricted to this. That is, the flight path may be determined by the conveyance controller 4.

While the example in which the flight controller 35 of the unmanned aerial vehicle 3 determines the flight path based on the flight prohibited area A1 has been shown in the aforementioned embodiment, the present disclosure is not restricted to this. That is, when an obstacle can be detected by an imager of the sensor 34 of the unmanned aerial vehicle 3, the flight path may be determined not based on the flight

What is claimed is:

1. A substrate working system comprising:
a plurality of substrate working apparatuses configured to perform work on a substrate on which a component is mounted;
a component storage spaced apart from the plurality of substrate working apparatuses and configured to store at least one of a device and the component to be used by the substrate working apparatuses;
a component conveyance flight vehicle configured to convey a conveyance article by flying from the component storage to a predetermined position corresponding to a predetermined substrate working apparatus while holding the conveyance article including at least one of the device and the component based on necessary article information of the substrate working apparatuses; and
a controller configured to make the component conveyance flight vehicle fly over the substrate working apparatuses so as to convey the conveyance article at a short distance from the component storage to the predetermined position, wherein
the controller is configured to set an order in which the component conveyance flight vehicle conveys the conveyance article based on information related to a shortage of the component from substrate working apparatuses inside a factory, after that, transmit a conveyance command signal to the component conveyance flight vehicle for conveying the component inside the factory along a flight path based on the order, and
the flight path is a path that the component conveyance flight vehicle departs from the component storage and returns to the component storage and in the path the component is conveyed to each of the substrate working apparatuses in accordance with the order.

2. The substrate working system according to claim 1, further comprising a controller configured to acquire the necessary article information from the plurality of substrate working apparatuses; wherein
the component conveyance flight vehicle is configured to convey the conveyance article based on the necessary article information acquired by the controller.

3. The substrate working system according to claim 2, wherein
the component conveyance flight vehicle is configured to perform autonomous flight to fly while being automatically operated; and
the controller is configured to control the component conveyance flight vehicle in a state of holding the conveyance article to autonomously fly from the component storage to the predetermined position based on the necessary article information.

4. The substrate working system according to claim 3, wherein the controller is configured to acquire degrees of request in which the plurality of substrate working apparatuses request the conveyance article based on the necessary article information of the plurality of substrate working apparatuses, and is configured to control the component conveyance flight vehicle to preferentially convey the conveyance article with a higher degree of request.

5. The substrate working system according to claim 4, wherein the component conveyance flight vehicle extends in a vertical direction from a vicinity of a position of a center of gravity of the component conveyance flight vehicle in a plan view, and includes a shaft member that is configured to hold the conveyance article.

6. The substrate working system according to claim 4, wherein the predetermined position includes at least one of a position in a vicinity of the predetermined substrate working apparatus and a position in a vicinity of an operator who performs the work on the predetermined substrate working apparatus.

7. The substrate working system according to claim 3, wherein the component conveyance flight vehicle extends in a vertical direction from a vicinity of a position of a center of gravity of the component conveyance flight vehicle in a plan view, and includes a shaft member that is configured to hold the conveyance article.

8. The substrate working system according to claim 3, wherein the predetermined position includes at least one of a position in a vicinity of the predetermined substrate working apparatus and a position in a vicinity of an operator who performs the work on the predetermined substrate working apparatus.

9. The substrate working system according to claim 2, wherein
the component conveyance flight vehicle is configured to hold a plurality of conveyance articles; and
the controller is configured to control the component conveyance flight vehicle to hold the plurality of conveyance articles in a reverse order of an order in which the component conveyance flight vehicle conveys the plurality of conveyance articles.

10. The substrate working system according to claim 9, wherein the component conveyance flight vehicle extends in a vertical direction from a vicinity of a position of a center of gravity of the component conveyance flight vehicle in a plan view, and includes a shaft member that is configured to hold the conveyance article.

11. The substrate working system according to claim 9, wherein the predetermined position includes at least one of a position in a vicinity of the predetermined substrate working apparatus and a position in a vicinity of an operator who performs the work on the predetermined substrate working apparatus.

12. The substrate working system according to claim 2, wherein the controller is configured to perform control of any of determining a flight path along which the component conveyance flight vehicle conveys the conveyance article in a flight area set in advance based on arrangement positions of the substrate working apparatuses, and is configured to determine the flight path in an area other than a flight prohibited area set in advance.

13. The substrate working system according to claim 12, wherein the component conveyance flight vehicle extends in a vertical direction from a vicinity of a position of a center of gravity of the component conveyance flight vehicle in a plan view, and includes a shaft member that is configured to hold the conveyance article.

14. The substrate working system according to claim 12, wherein the predetermined position includes at least one of a position in a vicinity of the predetermined substrate working apparatus and a position in a vicinity of an operator who performs the work on the predetermined substrate working apparatus.

15. The substrate working system according to claim 2, wherein the component conveyance flight vehicle extends in a vertical direction from a vicinity of a position of a center of gravity of the component conveyance flight vehicle in a plan view, and includes a shaft member that is configured to hold the conveyance article.

16. The substrate working system according to claim 2, wherein the predetermined position includes at least one of a position in a vicinity of the predetermined substrate working apparatus and a position in a vicinity of an operator who performs the work on the predetermined substrate working apparatus.

17. The substrate working system according to claim 1, wherein the component conveyance flight vehicle extends in a vertical direction from a vicinity of a position of a center of gravity of the component conveyance flight vehicle in a plan view, and includes a shaft member that is configured to hold the conveyance article.

18. The substrate working system according to claim 17, wherein the conveyance article includes a reel including a through-hole provided in the vicinity of the position of the center of gravity in the plan view and through which the shaft member passes, and that is configured to store the component to be mounted on the substrate.

19. The substrate working system according to claim 1, wherein the predetermined position includes at least one of a position in a vicinity of the predetermined substrate working apparatus and a position in a vicinity of an operator who performs the work on the predetermined substrate working apparatus.

20. A method for conveying a component in a substrate working system comprising a plurality of substrate working apparatuses that are configured to perform work on a substrate on which the component is mounted, the method comprising:
acquiring necessary article information from the plurality of substrate working apparatuses;
operating a component conveyance flight vehicle to convey a conveyance article by flying from a component storage, spaced apart from the plurality of substrate working apparatuses and configured to store at least one of a device and the component to be used by the substrate working apparatuses, to a predetermined position corresponding to a predetermined substrate working apparatus while holding the conveyance article including at least one of the device and the component based on the necessary article information;
making the component conveyance flight vehicle fly over the substrate working apparatuses so as to convey the conveyance article at a short distance from the component storage to the predetermined position; and
setting an order in which the component conveyance flight vehicle conveys the conveyance article based on information related to a shortage of the component from substrate working apparatuses inside a factory, after that, transmit a conveyance command signal to the component conveyance flight vehicle for conveying the component inside the factory along a flight path based on the order,
wherein the flight path is a path that the component conveyance flight vehicle departs from the component storage and returns to the component storage and in the path the component is conveyed to each of the substrate working apparatuses in accordance with the order.

* * * * *